United States Patent
Chiba (10) Patent No.: US 8,731,050 B2
(45) Date of Patent: May 20, 2014

(54) IMAGE ENCODING APPARATUS AND IMAGE DECODING APPARATUS

(75) Inventor: Takuma Chiba, Osaka (JP)

(73) Assignee: Panasonic Corporation, Osaka (JP)

( * ) Notice: Subject to any disclaimer, the term of this patent is extended or adjusted under 35 U.S.C. 154(b) by 481 days.

(21) Appl. No.: 12/808,887

(22) PCT Filed: Dec. 18, 2008

(86) PCT No.: PCT/JP2008/003835
§ 371 (c)(1),
(2), (4) Date: Jun. 17, 2010

(87) PCT Pub. No.: WO2009/081553
PCT Pub. Date: Jul. 2, 2009

(65) Prior Publication Data
US 2010/0272172 A1    Oct. 28, 2010

(30) Foreign Application Priority Data
Dec. 21, 2007  (JP) .................................. 2007-330253

(51) Int. Cl.
*H04N 7/50* (2006.01)

(52) U.S. Cl.
USPC ............ 375/240.02; 375/240.03; 375/240.09; 375/240.04; 375/240.05; 375/240.06; 375/240.07; 375/240.08

(58) Field of Classification Search
USPC .............................. 370/476; 341/50, 67, 107; 375/240.2–29
See application file for complete search history.

(56) References Cited

U.S. PATENT DOCUMENTS 5,333,212 A * 7/1994 Ligtenberg .................... 382/250
5,748,904 A * 5/1998 Huang et al. .................. 345/544
6,542,644 B1 * 4/2003 Satoh ............................ 382/246
6,954,156 B2 * 10/2005 Kadono et al. .................. 341/67
7,190,289 B2    3/2007 Kobayashi et al.

(Continued)

FOREIGN PATENT DOCUMENTS

| JP | 2003-259370 | 9/2003 |
|----|-------------|--------|
| JP | 2004-129206 | 4/2004 |
| JP | 2005-223533 | 8/2005 |
| JP | 2007-150569 | 6/2007 |

OTHER PUBLICATIONS

Thomas Wiegand et al., Study of Final Committee Draft of Joint Video Specification (ITU-T Rec. H.264 | ISO/IEC 14496-10 AVC), Joint Video Team (JVT) of ISO/IEC MPEG & ITU-T VCEG (ISO/IEC JTC1/SC29/WG11 and ITU-T SG16 Q.6) 6th Meeting: Awaji, Island, JP, Dec. 5-13, 2002, pp. 28, 49-51, [JVT-F100].

*Primary Examiner* — Dave Czekaj
*Assistant Examiner* — Shanika Brumfield
(74) *Attorney, Agent, or Firm* — Wenderoth, Lind & Ponack, L.L.P.

(57) ABSTRACT

An image encoding apparatus encodes image data and includes an image encoding unit that receives an input of the image data and image parameters and generates encoded image data by performing image encoding on the image data with reference to the image parameters and furthermore binarizing and arithmetically encoding the image data. A parameter processing unit outputs, as parameter information, parameters that are included in the image parameters and that are referred to when the encoded image data is arithmetically decoded, and encodes the image parameters to generate and output encoded image parameters. A stream generation unit generates a stream including the encoded image data obtained from the image encoding unit and the parameter information and the encoded image parameters that are outputted from the parameter processing unit.

12 Claims, 11 Drawing Sheets

(56) References Cited

U.S. PATENT DOCUMENTS

| | | |
|---|---|---|
| 7,298,303 B2 * | 11/2007 | Kobayashi et al. ............ 341/107 |
| 7,408,488 B2 * | 8/2008 | Sekiguchi et al. ............. 341/107 |
| 8,144,788 B2 * | 3/2012 | Song et al. ............... 375/240.26 |
| 2005/0012647 A1 | 1/2005 | Kadono et al. |
| 2005/0146451 A1 | 7/2005 | Kobayashi et al. |
| 2005/0156763 A1 * | 7/2005 | Kadono et al. ................ 341/107 |
| 2006/0145897 A1 * | 7/2006 | Kadono et al. .................. 341/59 |
| 2006/0202872 A1 | 9/2006 | Kobayashi et al. |
| 2007/0098083 A1 * | 5/2007 | Visharam et al. ........ 375/240.26 |
| 2007/0270103 A1 * | 11/2007 | Kim ................................ 455/69 |
| 2007/0291788 A1 * | 12/2007 | Sammour et al. ............. 370/466 |
| 2007/0291854 A1 * | 12/2007 | Song et al. ............... 375/240.27 |

* cited by examiner

| nal_unit_type | Content of NAL unit and RBSP syntax structure |
|---|---|
| 0 | Unspecified |
| 1 | Coded slice of a non-IDR picture<br>slice_layer_without_partitioning_rbsp() |
| 2 | Coded slice data partition A<br>slice_data_partition_a_layer_rbsp() |
| 3 | Coded slice data partition B<br>slice_data_partition_b_layer_rbsp() |
| 4 | Coded slice data partition C<br>slice_data_partition_c_layer_rbsp() |
| 5 | Coded slice of an-IDR picture<br>slice_layer_without_partitioning_rbsp() |
| 6 | Supplemental enhancement information (SEI)<br>sei rbsp() |
| 7 | Sequence parameter set<br>seq_parameter_set_rbsp() |
| 8 | Picture parameter set<br>seq_parameter_set_rbsp() |
| 9 | Access unit delimiter<br>access_unit_delimiter_rbsp() |
| 10 | End of sequence<br>end_of_seq_rbsp() |
| 11 | End of stream<br>end_of_stream_rbsp() |
| 12 | Filler data<br>filler_data_rbsp() |
| 13 | Sequence parameter set extension<br>seq_parameter_set_extension_rbsp() |
| 14..18 | Reserved |
| 19 | Coded slice of an auxiliary coded picture without partitioning<br>slice_layer_without_partitioning_rbsp() |
| 20..23 | Reserved |
| 24..31 | Unspecified |

FIG. 5

Parameter Information Structure chroma_format_idc
    pic_width_in_mbsminus1
    mb_adaptive_frame_field_flag
    direct_8x8_inference_flag
    entropy_coding_mode_flag
    num_ref_idx_l0_active_minus1
    num_ref_idx_l1_active_minus1
    pic_init_qp_minus26
    transform_8x8_mode_flag
    field_pic_flag
    cabac_init_idc
    slice_qp_delta
    MbaffFrameFlag
    slice_header() data amount

IMAGE ENCODING APPARATUS AND IMAGE DECODING APPARATUS

BACKGROUND OF THE INVENTION

1. Technical Field

The present invention relates to an image encoding apparatus that encodes an image, an image decoding apparatus that decodes encoded image data, and methods thereof, and relates particularly to a control method for parameter information referred to when decoding encoded image data obtained by arithmetically encoding a moving picture according to H.264/AVC.

2. Background Art

The standardization of "H.264/AVC" as a new video compression standard has been advanced by the formation of the JVT (Joint Video Team) by the ITU-T and the ISO/IEC JTC1, and was recognized as a recommendation in May of 2003. H.264/AVC is said to achieve approximately twice the compression rate of MPEG-2, which is used in satellite digital broadcasting, terrestrial digital broadcasting, and so on in Japan.

In order to achieve this high compression rate, H.264/AVC employs many video compression techniques, and carries out encoding by adaptively combining various compression techniques.

Entropy encoding (variable-length encoding) is included as one of the compression techniques employed by H.264/AVC. Two encoding schemes, or "CAVLC" and "CABAC", are included in the entropy encoding method. One of these schemes is selected during decoding based on a predetermined flag that has been encoded along with the encoded image data that is to be decoded (called "encoded image data" hereinafter).

Here, "CAVLC" is an acronym for "Context-Adaptive Variable Length Coding"; when encoding the DCT coefficient, this CAVLC scheme encodes the run and level, which is the length of continuous zeroes, from the direction opposite to the scanning direction using a variable-length encoding table.

"CABAC", meanwhile, is an acronym for "Context-based Adaptive Binary Arithmetic Coding", and is a scheme that performs encoding by changing the appearance frequency of encoding targets that change over time.

When decoding encoded image data, CAVLC or CABAC is selected based on an "entropy_coding_mode_flag" encoded within a "pic_parameter_set_rbsp( )" in the header information. When this "entropy_coding_mode_flag" is "0", CAVLC is selected, whereas when the "entropy_coding_mode_flag" is "1", CABAC is selected.

With CABAC, a context index (denoted as "ctxIdx" hereinafter) is added to each code to be compressed, and the compression rate of arithmetic encoding is improved by changing and managing the appearance frequency per ctxIdx.

Here, the "context index" is an identification number added to each of classifications obtained by classifying binary data of arithmetic encoding by syntax element, adjacent macroblock information, or the like.

Encoding processing according to CABAC can be divided mainly into two processes. The first process is a process called "binarization", in which multivalued information that is to be encoded, called a "syntax element", is converted into binary data. The second process is a process that calculates a ctxIdx for the binary data obtained through the binarization and performs arithmetic encoding.

Processing for decoding encoded image data obtained through CABAC can, as with the aforementioned encoding, be divided into two processes. These processes are a process for outputting binary data by arithmetically decoding the encoded image data, and a process for performing multivalue conversion by converting the binary data into a syntax element.

With CABAC, the compression rate is improved by providing parameters for each picture and each slice. Specifically, there are such parameters as "pic_width_in_MBs", "pic_height_in_MBs", "Slice_QPy", "cabac_init_idc", "slice_type", and so on. When encoding using CABAC, the initialization of random variables and so on is performed using these parameters, and encoding is executed using a set image size.

The aforementioned parameters are encoded as information contained in "seq_parameter_set_rbsp( )", "pic_parameter_set_rbsp( )", "slice_header( )", and so on, and are placed before a "VCL Nal unit" in which the encoded image data is stored.

When decoding a stream encoded using H.264/AVC, "seq_parameter_set_rbsp( )" "pic_parameter_set_rbsp( )", "slice_header( )", and so on are decoded, and the aforementioned "entropy_coding_mode_flag" is extracted. It is then determined whether to decode using CAVLC or CABAC based on whether the value of the "entropy_coding_mode_flag" is "0" or "1".

In the case where decoding is carried out through CABAC, the parameters used in CABAC decoding are extracted, the initialization of random variables and so on is performed using the extracted parameters, and arithmetic decoding is executed.

Meanwhile, as described earlier, the CABAC encoding and decoding processing can both be divided into two processes. These processes are the binarization and multivalue conversion of the syntax element, and the arithmetic encoding and arithmetic decoding.

By nature, the arithmetic encoding process can only encode a single bit in a single cycle, and the arithmetic decoding process can only decode a single bit in a single cycle. For this reason, it is assumed that the binarization process and the arithmetic encoding process are performed asynchronously. Likewise, it is also assumed that the multivalue conversion process and the arithmetic decoding process are performed asynchronously as well.

A method in which variable-length decoding and processes aside from variable-length decoding are performed asynchronously using a buffer exists as an image decoding method according to a conventional technique.

Specifically, in an image decoding method that decodes inputted encoded image data, each variable-length codeword within the encoded image data undergoes variable-length decoding into uniquely corresponding intermediate code, and the decoded intermediate code is temporarily stored in a buffer.

The intermediate code stored in the buffer is then read, analyzed according to the syntax of the image encoding, and the image is decoded. This method for performing the variable-length decoding and processes aside from the variable-length decoding asynchronously has been proposed (for example, see PTL 1).

The following processing flow is obtained when the method disclosed in the stated PTL 1 is applied to CABAC decoding. That is, the inputted encoded image data that has undergone arithmetic decoding is taken as intermediate code, and this intermediate code is temporarily stored in a buffer. After this, the intermediate code stored in the buffer is read, the intermediate code undergoes multivalue conversion, and the image is decoded.

Figure 10:
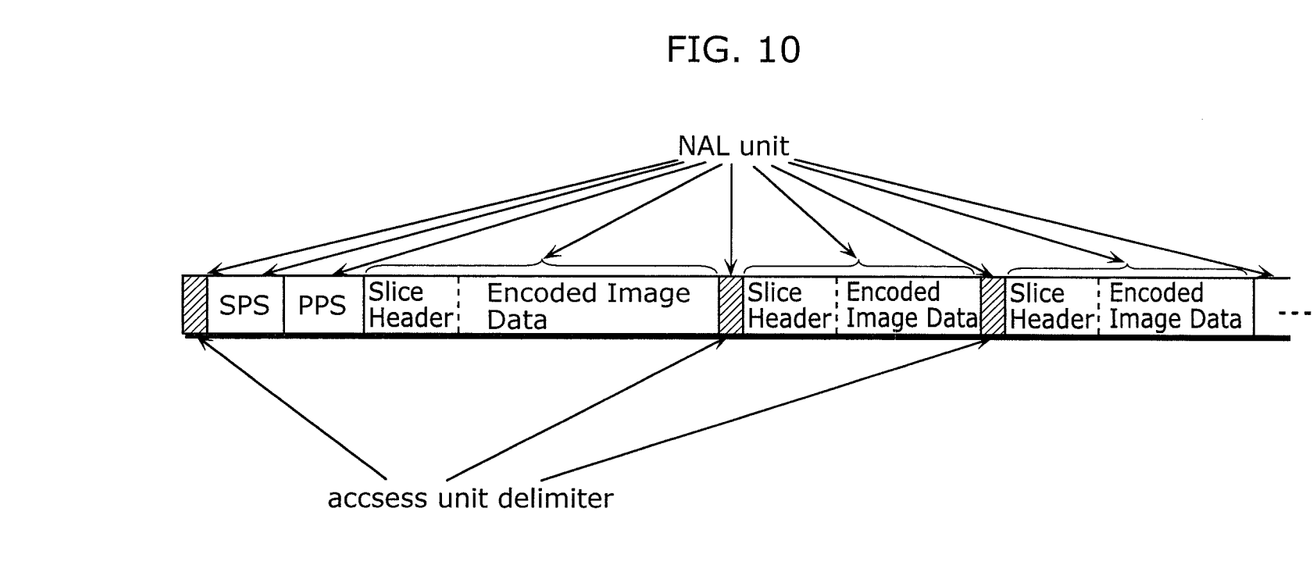
FIG. 10 is a diagram illustrating an example of the data structure of a conventional stream.

FIG. 10 is a diagram illustrating an example of the data structure of a conventional stream. As shown in FIG. 10, the conventional encoded image data stream is configured in units of "NAL units", and the parameters necessary for arithmetically decoding the encoded image data are extracted by decoding the slice header and so on Note that "SPS" contained in the stream illustrated in FIG. 10 is the "seq_parameter_set_rbsp( )", whereas the "PPS" is the "pic_parameter_set_rbsp( )".

Figure 11:
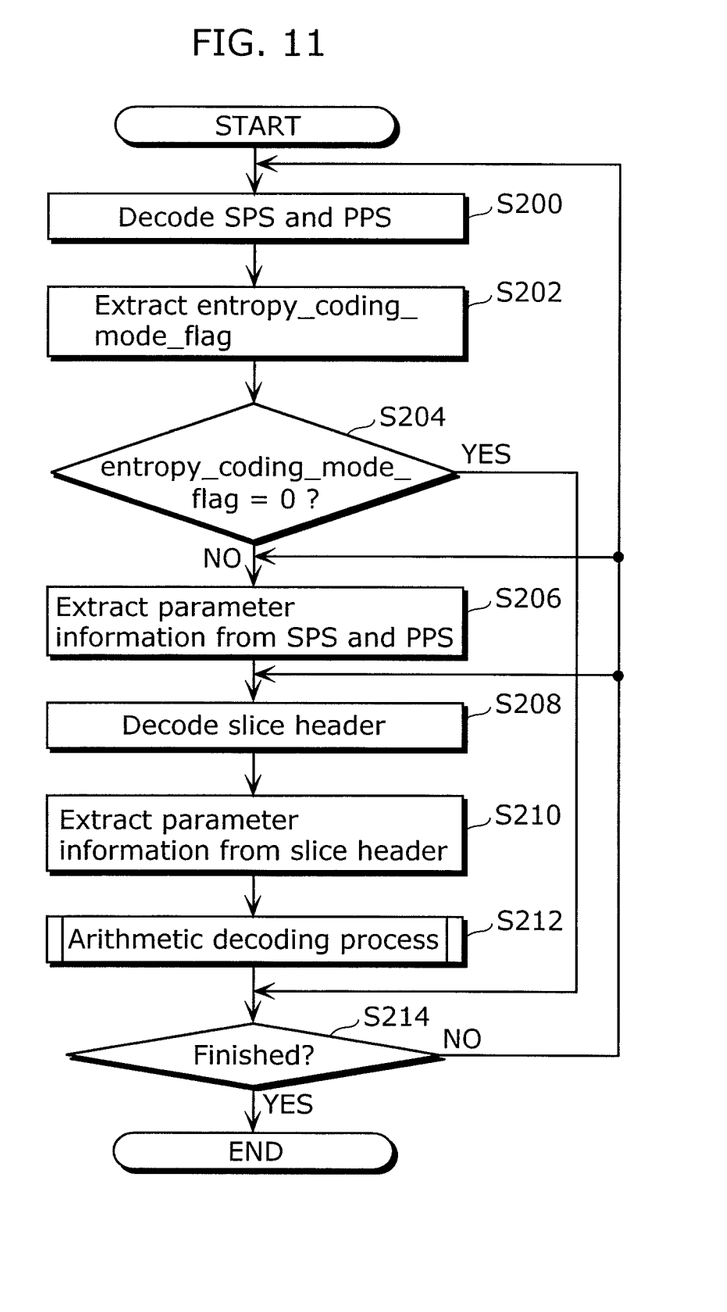
FIG. 11 is a flowchart illustrating the flow of the conventional decoding process.

FIG. 11 is a flowchart illustrating the flow of the conventional decoding process.

In the conventional decoding process illustrated in FIG. 11, first, the SPS and PPS in the encoded image data are decoded (S200), and an "entropy_coding_mode_flag" is extracted (S202).

In the case where the "entropy_coding_mode_flag" is "1" (NO in S204), parameters are extracted from the decoded SPS and PPS (S206), and the slice header is decoded (S208).

Note, however, that in the case where the "entropy_coding_mode_flag" is "0" (S204: YES), the arithmetic decoding process (S212) is not executed (is skipped).

After this, the arithmetic decoding process is executed on the encoded image data by referring to the extracted parameters (S212). Then, in the case where there is no other encoded image data to be decoded, the process ends (S214: YES).

With the image decoding apparatus in which the stated PTL 1 has been applied, the "entropy_coding_mode_flag" is decoded in order to determine whether CAVLC or CABAC is used in the entropy encoding of the inputted encoded image data, and it can be seen that CABAC is used in the case where the value of that flag is "1".

Next, the "seq_parameter_set_rbsp( )", "pic_parameter_set_rbsp( )", "slice_header( )", and so on are decoded and parameters extracted in order to perform the CABAC arithmetic decoding. Using the extracted parameters, the initialization of random variables and so on is performed, and the arithmetic decoding process is carried out.

Here, the intermediate code is configured of the decoded image data, the "seq_parameter_set_rbsp( )", the "pic_parameter_set_rbsp( )", the "slice_header( )", and so on, but in order to reduce the size of the buffer, the data aside from the decoded image data is stored in the buffer while remaining in an encoded state.

In order to perform the post-arithmetic decoding multi-value conversion process using a uniform procedure, these parameters are stored in the buffer while remaining in an encoded state.

Patent Reference 1: Japanese Patent Application Publication No. 2003-259370

SUMMARY OF INVENTION

However, in the stated conventional technique, when the intermediate code stored in the buffer is read and the image restored, it is necessary to once again decode the aforementioned "seq_para meter_set_rbsp( )", "pic_parameter_set_rbsp( )", "slice_header( )", and so on (S200 and S208). There is thus a problem in that the amount of computational processing increases, and the enlargement of LSI circuitry leads to an increase in costs.

Having been achieved in order to solve the aforementioned problems, it is an object of the present invention to provide an image encoding apparatus and an image decoding apparatus that make it possible to avoid an increase in the amount of computational processing and an enlargement in LSI circuitry involved with the decoding of parameter information referred to in arithmetic decoding processing.

In order to achieve the aforementioned object, an image encoding apparatus according to the present invention encodes image data, and includes: an image encoding unit that receives an input of the image data and image parameters and generates encoded image data by performing image encoding on the image data with reference to the image parameters and furthermore binarizing and arithmetically encoding the image data; a parameter processing unit that outputs, as parameter information, parameters that are included in the image parameters and that are referred to when the encoded image data is arithmetically decoded, and encodes the image parameters to generate and output encoded image parameters; and a stream generation unit that generates a stream including the encoded image data obtained from the image encoding unit and the parameter information and the encoded image parameters that are outputted from the parameter processing unit.

Through this configuration, the image encoding apparatus of the present invention can include parameters necessary for arithmetically decoding the encoded image data in the stream that includes the encoded image data separate from encoded image parameters that contain those necessary parameters.

Accordingly, an image decoding apparatus that decodes the encoded image data does not need to decode the encoded image parameters, and can easily obtain the parameters necessary for arithmetic decoding simply by referring to the parameter information.

In other words, the image encoding apparatus of the present invention makes it possible to avoid an increase in the amount of computational processing and an enlargement in LSI circuitry involved with the decoding for obtaining the parameter information in the image decoding apparatus.

Meanwhile, the parameter information may indicate parameters referred to when the image encoding unit arithmetically encodes the image data using H.264/AVC CABAC.

In addition, the parameter information may include an entropy_coding_mode_flag conforming to H.264/AVC CABAC.

In addition, the parameter information may include information expressing a data amount from the head of a nal_unit to the start of a slice_data( ) in the nal_unit that includes the slice_data( ) conforming to H.264/AVC CABAC.

In addition, the stream generation unit may place the parameter information before a variable-length codeword that is to be arithmetically decoded, when generating the stream.

In addition, the parameter information may be stored within a user_data_unsigned_SEI according to H.264/AVC CABAC.

In addition, the parameter processing unit may output the parameters referred to when the encoded image data is arithmetically decoded as parameter information without encoding the parameters.

In addition, in order to achieve the aforementioned object, an image decoding apparatus according to the present invention decodes encoded image data that is image data that has been binarized and arithmetically encoded, and includes: an arithmetic decoding unit that receives an input of a stream having the encoded image data and parameter information including parameters referred to when arithmetically decoding the encoded image data, and arithmetically decodes the encoded image data with reference to the parameters included in the parameter information without decoding the parameter information.

In other words, the image encoding apparatus of the present invention is capable of receiving a stream generated by the image encoding apparatus of the present invention and obtaining the parameters necessary for arithmetically decoding the encoded image data contained in that stream without performing a decoding process.

Note that the present invention can also be realized as an image encoding method or an image decoding method that implements the characteristic constituent elements of the stated image encoding apparatus or image decoding apparatus as steps, a program product for causing a computer to execute those steps, and so on. That program product can then be widely distributed via a recording medium such as a DVD or the like, a transmission medium such as the Internet or the like, and so on.

According to the image encoding apparatus of the present invention, it is possible to provide a stream that contains encoded image data with parameters necessary during arithmetic decoding separately from encoded image parameters including those parameters.

Meanwhile, when decoding a stream that has been encoded by the image encoding apparatus of the present invention, the image decoding apparatus according to the present invention does not need to perform a decoding process on information aside from image data, such as parameters and so on, when converting from encoded image data to intermediate code, or in other words, when arithmetically decoding the encoded image data. Through this, the amount of processing of the apparatus as a whole can be reduced, the processing time can be decreased, and the circuitry configuration can be simplified.

In this manner, the present invention is capable of providing an image encoding apparatus and an image decoding apparatus that make it possible to avoid an increase in the amount of computational processing and an enlargement in LSI circuitry involved with the decoding of parameter information referred to in arithmetic decoding processing.

NUMERICAL REFERENCES 100 image encoding apparatus
110 image encoding unit
120 parameter processing unit
130 stream generation unit
150, 250 LSI
200 image decoding apparatus
210 arithmetic decoding unit
220 buffer
230 syntax element generation unit
240 image decoding unit

DETAILED DESCRIPTION OF THE INVENTION

Embodiments of the present invention will be described hereinafter with reference to the drawings. Although the present invention will be described using the following embodiments and the appended drawings, it should be noted that the embodiments and drawings are for exemplary purposes only, and the present invention is not intended to be limited thereto in any way.

(Image Encoding Apparatus)

First, an image encoding apparatus 100 according to an embodiment of the present invention will be described using FIGS. 1 to 5.

Figure 1:
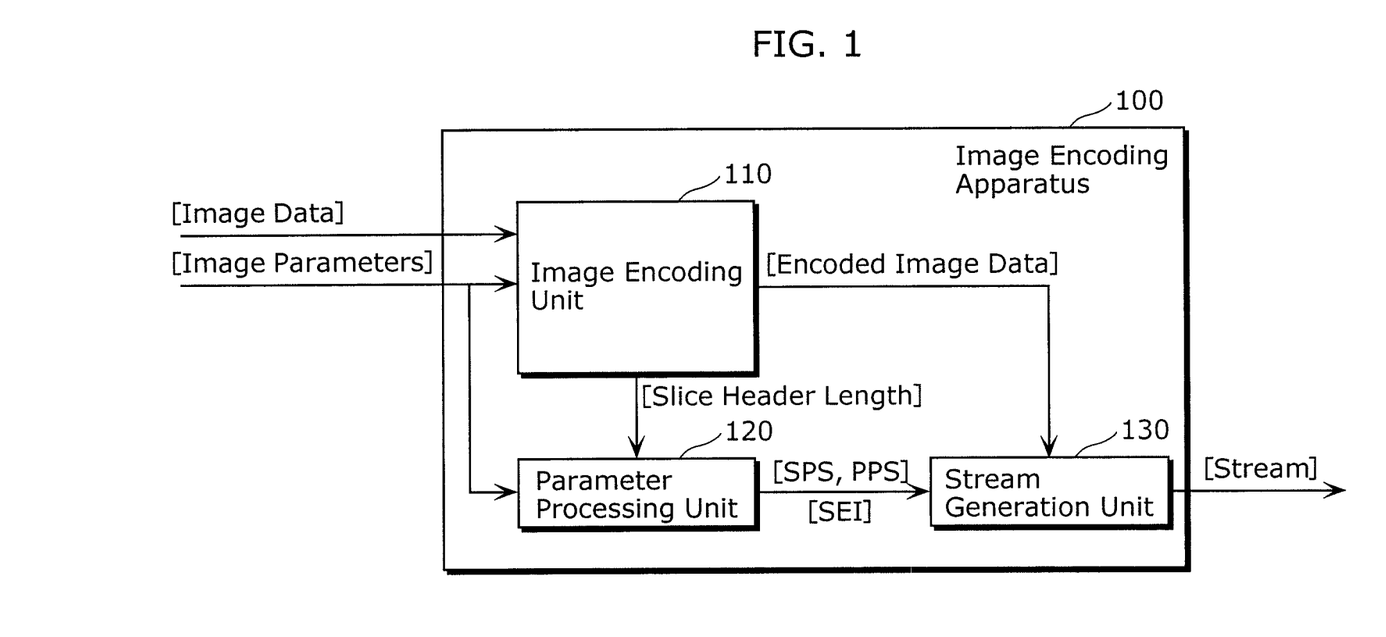
FIG. 1 is a block diagram illustrating an outline of the primary functional configuration of an image encoding apparatus according to an embodiment of the present invention.

FIG. 1 is a block diagram illustrating an outline of the primary functional configuration of the image encoding apparatus 100 according to an embodiment of the present invention.

As shown in FIG. 1, the image encoding apparatus 100 includes an image encoding unit 110, a parameter processing unit 120, and a stream generation unit 130.

The image encoding unit 110 is a processing unit that generates encoded image data by performing image encoding on inputted image data and then binarizing and arithmetically encoding the image data.

The image encoding unit 110 also accepts inputs of image parameters, which are information of the image size and so on, and generates the encoded image data referring to the image parameters. The generated encoded image data is inputted into the stream generation unit 130.

The parameter processing unit 120 is a processing unit that processes the image parameters. To be more specific, the parameter processing unit 120 outputs, as parameter information, parameters that are included in the image parameters and that are referred to when arithmetically decoding the encoded image data. The parameter processing unit 120 also generates encoded image parameters by encoding the image parameters.

Note that the parameter information is outputted from the parameter processing unit 120 in a state in which the parameter information is held in "SEI" (Supplemental Enhancement Information).

SEI is a NAL unit in which supplementary added information used when decoding the VCL (Video Coding Layer) is held.

When the payloadType with the SEI is "5", that SEI is a "user_data_unsigned_SEI".

The "user_data_unsigned_SEI" is a user area in which information uniquely defined by a user can be held. In other words, the parameter information referred to when performing arithmetic decoding is held in this "user_data_unsigned_SEI" (denoted simply as "SEI" hereinafter).

Meanwhile, information indicating the size of a "slice_header( )"(slice header length) added in front of the encoded image data, and is inputted from the image encoding unit 110, which generates the "slice_header( )", to the parameter processing unit 120. The inputted slice header length is held in the SEI as part of the parameter information.

The parameter processing unit 120 also generates an SPS and a PPS by encoding various types of inputted image parameters according to VLC (Variable Length Coding). The SPS and PPS are examples of encoded image parameters according to the image encoding apparatus of the present invention.

The SEI, SPS, and PPS generated by the parameter processing unit 120 are inputted into the stream generation unit 130. In other words, the parameter information and encoded image parameters are inputted into the stream generation unit 130.

The stream generation unit 130 is a processing unit that generates a stream containing the encoded image data obtained from the image encoding unit 110 and the parameter information and encoded image parameters outputted from the parameter processing unit 120.

The data structure of the stream generated by the stream generation unit 130 will be described later using FIG. 3.

Note that the functional configuration of the image encoding apparatus 100 may be a configuration aside from that shown in FIG. 1.

For example, the image encoding unit 110 may carry out the generation of the parameter information and the generation of the encoded image parameters, which are handled by the parameter processing unit 120. In other words, the image encoding unit 110 may be provided with the functions of the parameter processing unit 120

Figure 2:
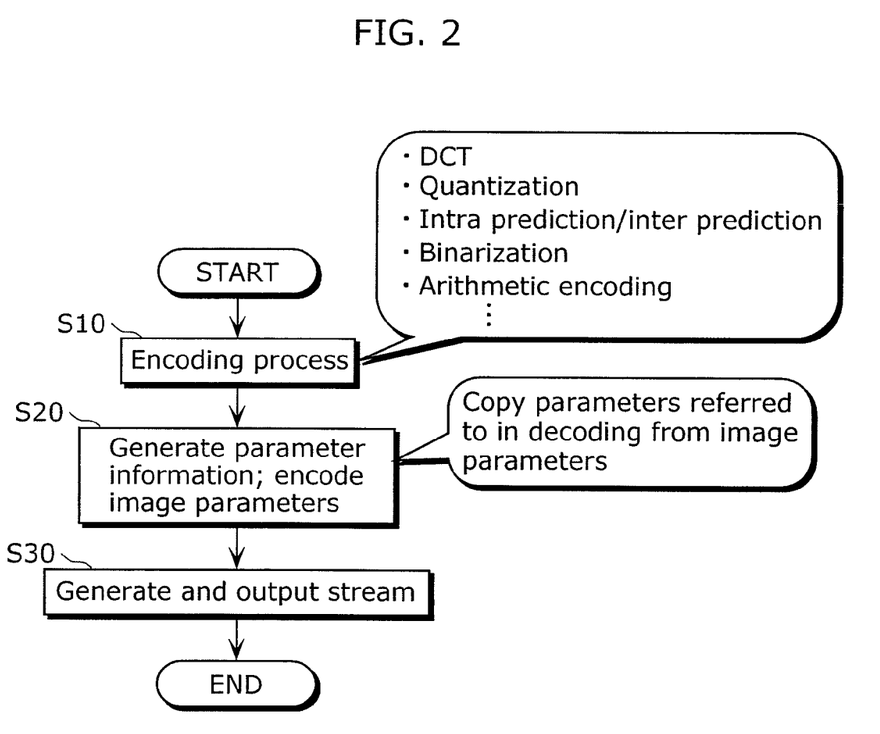
FIG. 2 is a flowchart illustrating an outline of the flow of encoding processing performed by an image encoding apparatus according to an embodiment.

FIG. 2 is a flowchart illustrating an outline of the flow of encoding processing performed by the image encoding apparatus 100 according to an embodiment. The flow of processing performed by the image encoding apparatus 100 will be described using FIG. 2.

The image encoding unit 110 encodes inputted image data by referring to inputted image parameters (S10).

To be more specific, processes such as direct cosine transforms (DCT), quantization, inter prediction or intra prediction, binarization, arithmetic encoding, and so on are performed by the image encoding unit 110.

Meanwhile, the parameter processing unit 120 generates the parameter information and the encoded image parameters (S20).

To be more specific, the parameter processing unit 120 copies, from the image parameters inputted thereto, parameters to be referred to when performing arithmetic decoding, and holds the copied parameters in the SEI. The parameter processing unit 120 also generates the SPS and PPS by performing variable-length encoding on the image parameters.

In other words, the parameter processing unit 120 chooses, from the various types of image parameters that have been inputted, the parameters necessary for decoding, and holds and outputs those parameters in the SEI as parameter information without encoding those parameters. The content of the parameter information held in the SEI will be described later using FIG. 5.

The stream generation unit 130 generates and outputs a stream containing the encoded image data inputted from the image encoding unit 110 and the SEI, SPS, and PPS inputted from the parameter processing unit 120 (S30).

Note that the encoding process (S10) and the generation of the parameter information and encoded parameters (S20) illustrated in FIG. 2 are not limited to the order indicated in FIG. 2.

In other words, these processing steps may be carried out in parallel, or the encoding process (S10) may be carried out later.

Figure 3:
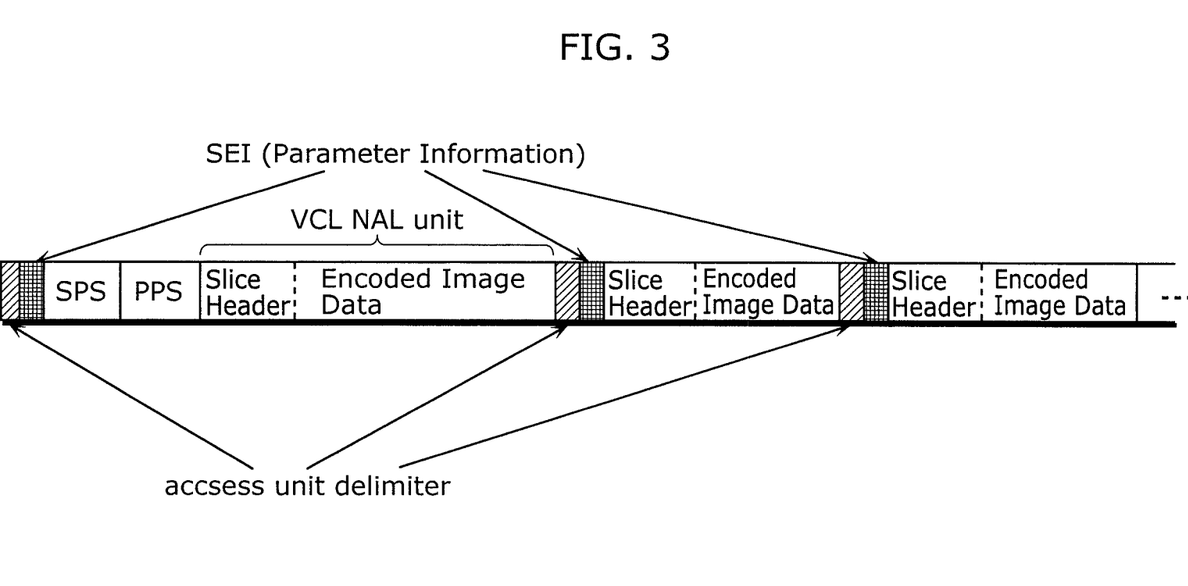
FIG. 3 is a diagram illustrating an exemplary data structure of a stream generated by an image encoding apparatus according to an embodiment.

FIG. 3 is a diagram illustrating an exemplary data structure of the stream generated by the image encoding apparatus 100 according to an embodiment.

Generally speaking, data streams in the H.264/AVC standard are configured of multiple "NAL units".

The type of each "NAL unit" is determined by parameters encoded at the head of the "NAL unit", or in other words, by a "nal_unit_type".

Figure 4:
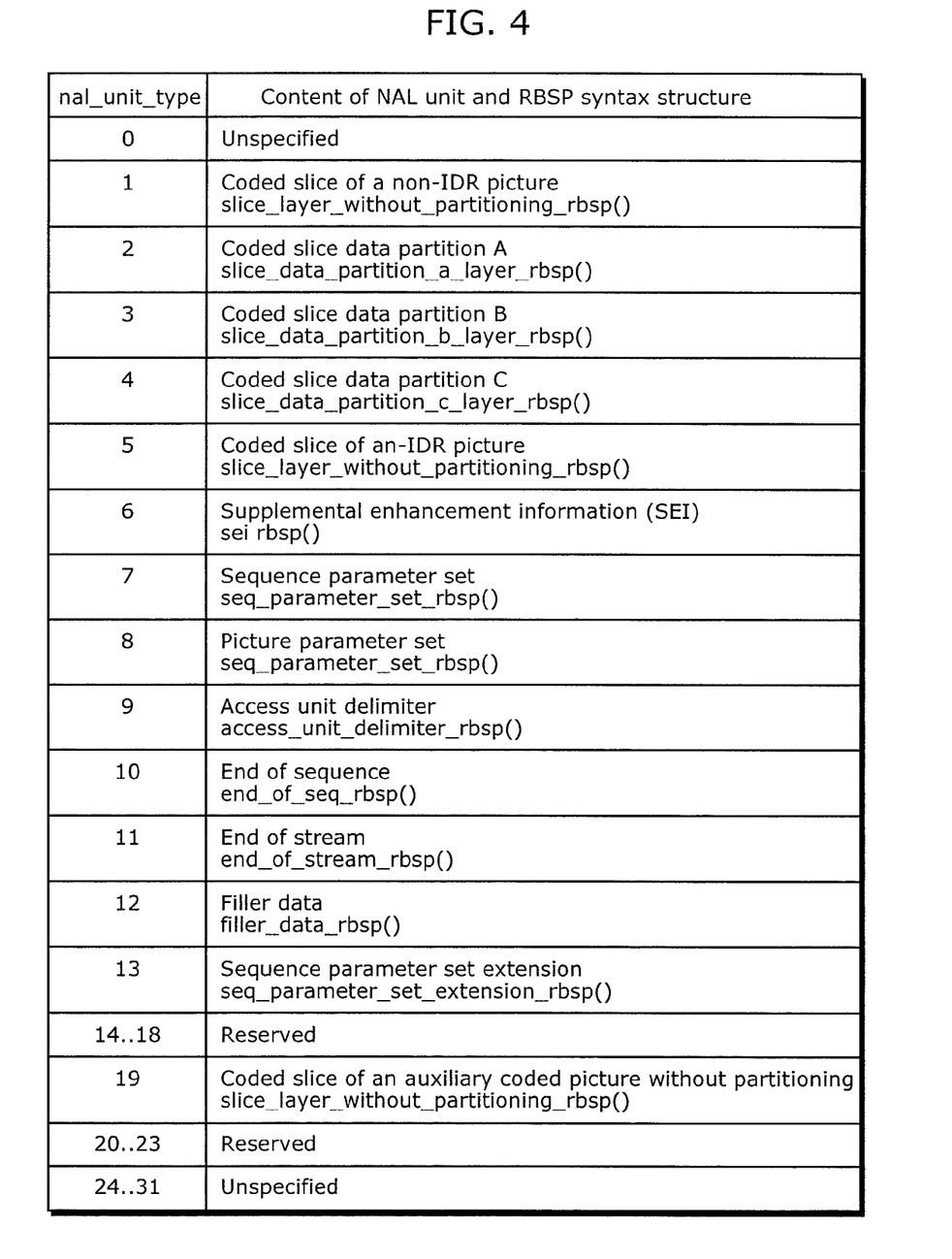
FIG. 4 is a diagram illustrating the correspondence between "nal_unit_type" values and "NAL unit" content.

FIG. 4 is a diagram illustrating the correspondence between "nal_unit_type" values and "NAL unit" content.

As shown in FIG. 4, when the "nal_unit_type" is "9", the "NAL unit" is an "access unit delimiter".

The head of the stream illustrated in FIG. 3 is an "access unit delimiter", and an SEI in which parameter information is held is disposed immediately thereafter.

The SPS and PPS are located after the SEI, and a "slice_layer_without_partitioning", which is a "VCL NAL unit", is located thereafter.

The "VCL NAL unit" is primarily configured of a "slice_header( )"and "slice_data( )", and the encoded image data is held in the "slice_data( )".

An "access unit delimiter" also follows the "VCL NAL unit", thus beginning a new access unit.

An SEI is once again located after the "access unit delimiter". Note that the same parameter information as the previous SEI is held within this SEI.

Furthermore, the "SPS" and "PPS" may or may not follow this SEI. A "VCL NAL unit" is located after that.

Figure 5:
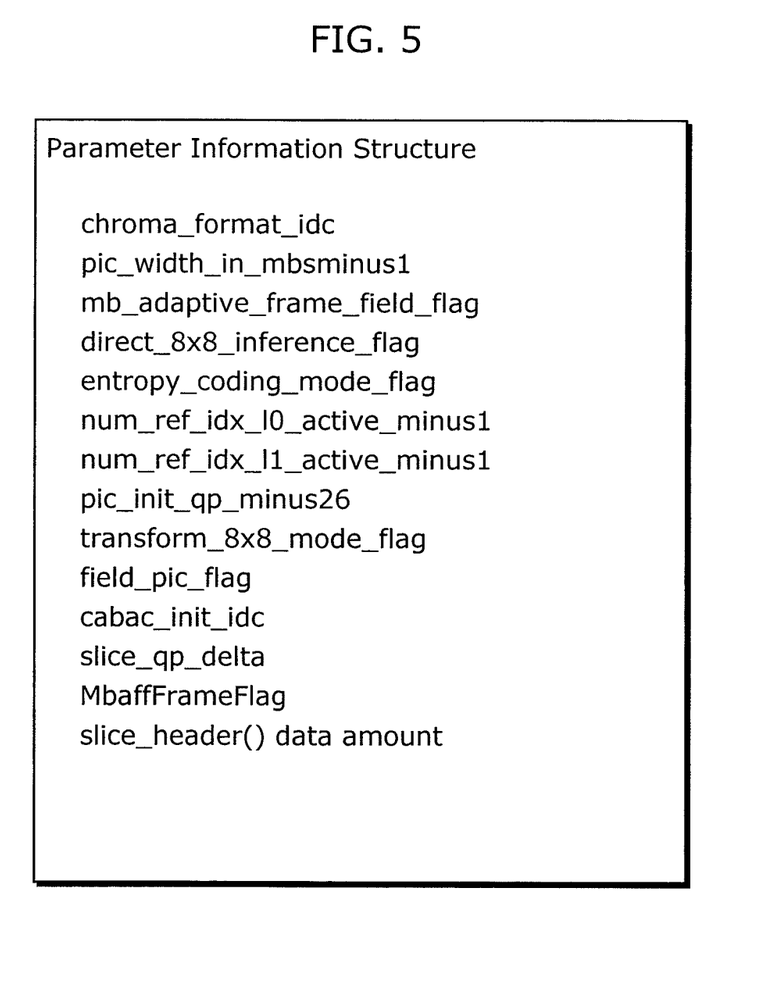
FIG. 5 is a diagram illustrating an exemplary structure of parameter information held in an SEI according to an embodiment.

FIG. 5 is a diagram illustrating an exemplary structure of parameter information held in an SEI according to an embodiment.

Note that this parameter information is present in each SPS, PPS, or "slice_header( )".

The "MbaffFrameFlag" in FIG. 5 is parameter information obtained through the following [Math. 1].

$$\text{MbaffFrameFlag} = (mb\_adaptive\_frame\_field\_flag \,\&\&\, !\, field\_pic\_flag) \qquad [\text{Math. 1}]$$

The "mb_adaptive_frame_field_flag" is a syntax element within the SPS, whereas the "field_pic_flag" is a syntax element within the slice_header( ).

Furthermore, an "entropy_coding_mode_flag" is a syntax element within the PPS, and determines the mode of the variable-length encoding for the encoded image data contained within that stream.

As described earlier, in the case where the "entropy_coding_mode_flag" is "0", "Exp-Golomb" and "CAVLC" are selected for the variable-length encoding mode.

However, in the case where the "entropy_coding_mode_flag" is "1", "CABAC" is selected. An arithmetic decoding process is executed only when CABAC has been selected.

The other syntax elements are used when executing a "slice_data( )" sequence process and the CABAC arithmetic decoding process.

In this manner, when generating a stream that includes encoded image data, rather than encoding the various parameters referred to during arithmetic decoding in the encoded image data, the image encoding apparatus according to this embodiment of the present invention includes those parameters as parameter information in the SEI, which is a user data area of the stream.

Here, the functional configuration of an image decoding apparatus that decodes an AVC/H.264 stream encoded through CABAC through a two-stage process can be divided into a former-stage processing unit that performs arithmetic decoding and a latter-stage processing unit that decodes variable-length code.

With the latter-stage processing unit, decoding aside from the arithmetic decoding, including the decoding of the header portion that includes the aforementioned various parameters, is carried out.

On the other hand, with the former-stage processing unit, only the arithmetic decoding is carried out. However, in order to perform arithmetic decoding, the various types of parameters held in the header portion are necessary. For this reason, it is necessary to decode the header portion using the former-stage processing unit as well when arithmetically decoding a conventional stream.

Meanwhile, due to the nature of variable-length code, it is not possible to extract only the necessary parameters from the header portion and decode those parameters, and thus it is necessary to decode the entire header portion. The processing burden placed on the former-stage processing unit increases as a result.

Furthermore, it is also necessary for the latter-stage processing unit to decode the encoded header portion in order to perform variable-length decoding on the encoded image data. Accordingly, because the processing burden on the image decoding apparatus as a whole increases, the enlargement of the LSI circuitry is necessary as well.

However, as described above, the image encoding apparatus 100 according to this embodiment can generate a stream in which the parameters necessary during arithmetic decoding are included as parameter information separate from the encoded header portion.

Through this, the parameter information referred to during arithmetic decoding can be obtained with ease without the processing unit that performs the former-stage arithmetic decoding in the image decoding apparatus decoding the header portion (equivalent to the SPS, PPS, and slice header shown in FIG. 3).

Accordingly, the image encoding apparatus 100 according to this embodiment can avoid an increase in the amount of computational processing and an enlargement in LSI circuitry involved with the decoding for obtaining the parameter information necessary for the arithmetic decoding in the image decoding apparatus.

(Image Decoding Apparatus)

Next, an image decoding apparatus 200 according to an embodiment of the present invention will be described using FIGS. 6 and 7.

Figure 6:
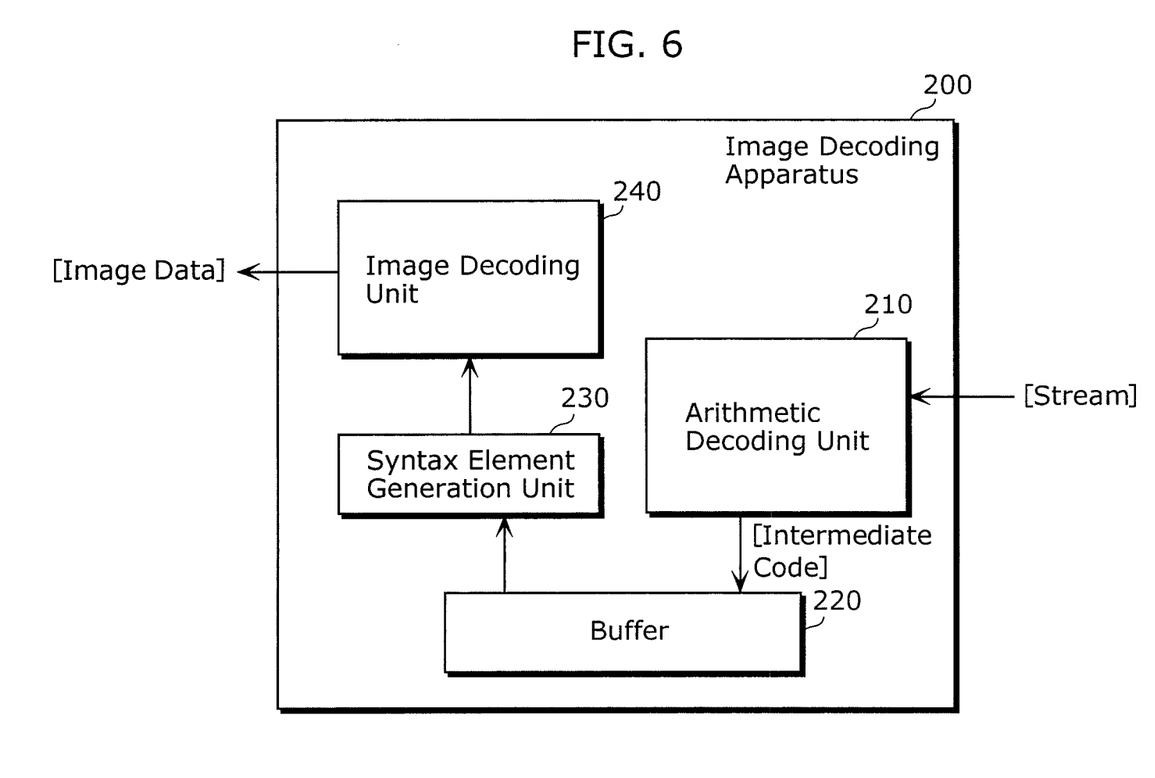
FIG. 6 is a block diagram illustrating an outline of the primary functional configuration of an image decoding apparatus according to an embodiment of the present invention.

FIG. 6 is a block diagram illustrating an outline of the primary functional configuration of the image decoding apparatus 200 according to this embodiment of the present invention.

The image decoding apparatus 200 illustrated in FIG. 6 is an apparatus that does not need to decode parameter information used during arithmetic decoding performed on encoded image data.

In other words, the image decoding apparatus 200 is an apparatus that decodes a stream generated by the aforementioned image encoding apparatus 100, and is an example of an apparatus that is capable of executing an arithmetic decoding process without decoding a header portion.

The image decoding apparatus 200 includes an arithmetic decoding unit 210, a buffer 220, a syntax element generation unit 230, and an image decoding unit 240.

The arithmetic decoding unit 210 arithmetically decodes each arithmetically-encoded variable-length codeword within encoded image data contained in an inputted stream into corresponding intermediate code, and temporarily holds the intermediate code obtained through this decoding in the buffer 220.

To be more specific, the arithmetic decoding unit 210 extracts the parameter information from the stream that contains the unencoded parameter information and the arithmetically-encoded image data and arithmetically decodes the arithmetically-encoded image data by referring to that parameter information.

The buffer 220 is, for example, a RAM, and holds the intermediate code generated by the arithmetic decoding unit 210.

The syntax element generation unit 230 generates syntax elements and the values thereof by reading out the intermediate code held in the buffer 220.

The image decoding unit 240 in inputted with the syntax elements and values thereof, and restores images according to a conventional method.

Note that the arithmetic decoding unit 210 corresponds to the aforementioned processing unit that performs the former-stage arithmetic decoding, whereas the syntax element generation unit 230 and image decoding unit 240 correspond to the aforementioned processing unit that performs the latter-stage variable-length decoding.

Next, operations performed by the image decoding apparatus 200 configured as described thus far will be described.

Figure 7:
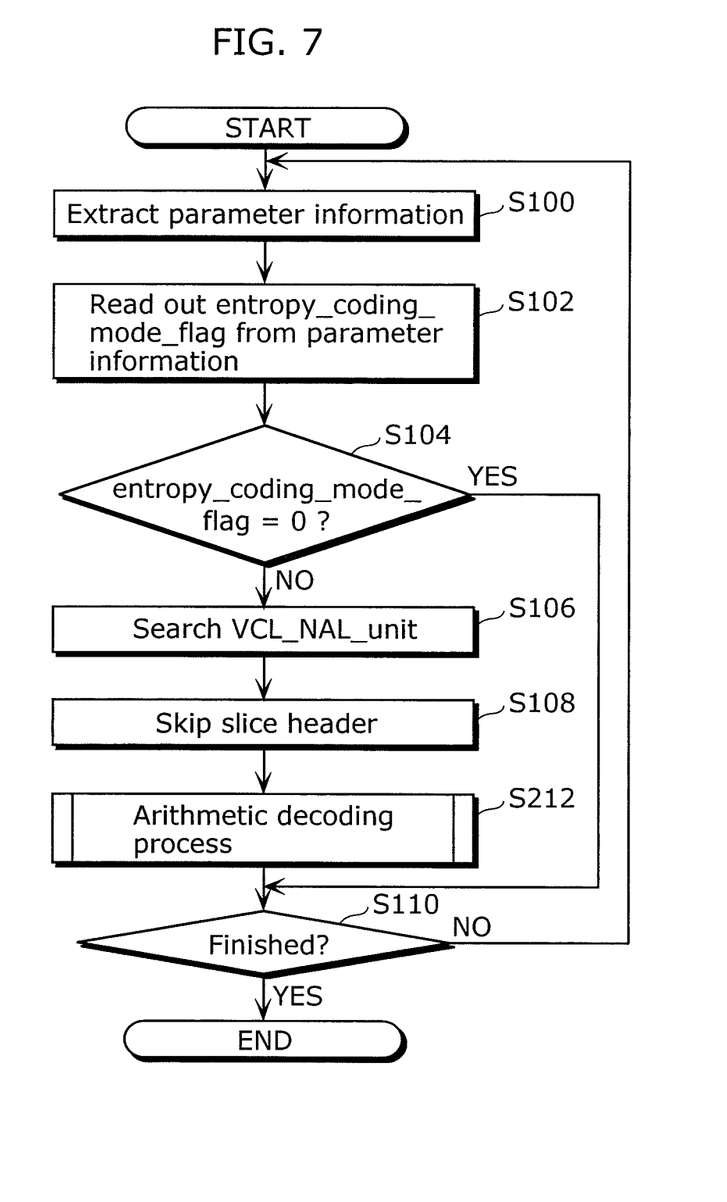
FIG. 7 is a flowchart illustrating an outline of the flow of decoding processing performed by an image decoding apparatus according to an embodiment.

FIG. 7 is a flowchart illustrating an outline of the flow of decoding processing performed by the image decoding apparatus 200 according to this embodiment.

Note that FIG. 7 illustrates the flow of arithmetic decoding processing, which is a feature of the image decoding apparatus 200.

The decoding process performed by the image decoding apparatus 200 starts with the extraction of the parameter information (S100). The parameter information is held within the SEI, as described above. For this reason, the arithmetic decoding unit 210 searches the inputted stream and identifies the "NAL unit" (the SEI) having "nal_unit_type=6".

The arithmetic decoding unit 210 then obtains the parameter information from the identified SEI (S102), and refers to the "entropy_coding_mode_flag" therein (S104).

When "entropy_coding_mode_flag"="0" (YES in S104), the variable-length encoding mode is not CABAC, and thus the process advances to a determination of whether or not the encoded image data has ended (S110) without performing the arithmetic decoding process.

When "entropy_coding_mode_flag=1" (NO in S104), the arithmetic decoding unit 210 searches for the "VCL_NAL_unit" (S106).

Upon finding the head of the "VCL NAL unit", the arithmetic decoding unit 210 skips the "VCL NAL unit" to the end of the slice header based on the data amount of the slice header (slice header length) within the parameter information, and advances the data to the head of the "slice_data( )".

The arithmetic decoding unit 210 then arithmetically decodes the variable-length codewords within the "slice_data( )" using the parameter information (S212).

When the arithmetic decoding process has ended, it is checked whether or not encoded image data follows in that stream. If such data follows (NO in S110), the process returns to the extraction of parameter information (S100), and the processing continues. In the case where there is no encoded image data, the process ends (YES in S110).

After this, the intermediate code outputted from the arithmetic decoding unit 210 passes through the buffer 220 and is processed by the syntax element generation unit 230 and the image decoding unit 240 as described above. As a result, decoded image data is outputted from the image decoding apparatus 200.

As described thus far, the image decoding apparatus according to the present invention is capable of arithmetically decoding encoded image data without decoding the parameter information.

It should be noted that the embodiment described thus far assumes that the parameter information is present within the SEI. However, the image decoding apparatus 200 can also be configured so that in the case where the parameter information is not present in the SEI, the arithmetic decoding unit 210 can carry out the decoding process according to the aforementioned conventional procedure illustrated in the flowchart of FIG. 11.

Such a configuration makes it possible for the image decoding apparatus 200 to decode even a conventional stream that contains the various parameters necessary for arithmetic decoding in an encoded state when such a stream is inputted into the image decoding apparatus 200.

In addition, the image encoding apparatus 100 and image decoding apparatus 200 according to the embodiment can be realized using an LSI, which is a typical integrated circuit. In this case, the LSI may be configured using a single chip or multiple chips.

For example, the functional blocks aside from the memories may be configured as a single-chip LSI. Note that although the term "LSI" is used here, other names, such as "IC", "system LSI", "super LSI", "ultra LSI", and so on are used depending on the degree of integration.

Figure 8:
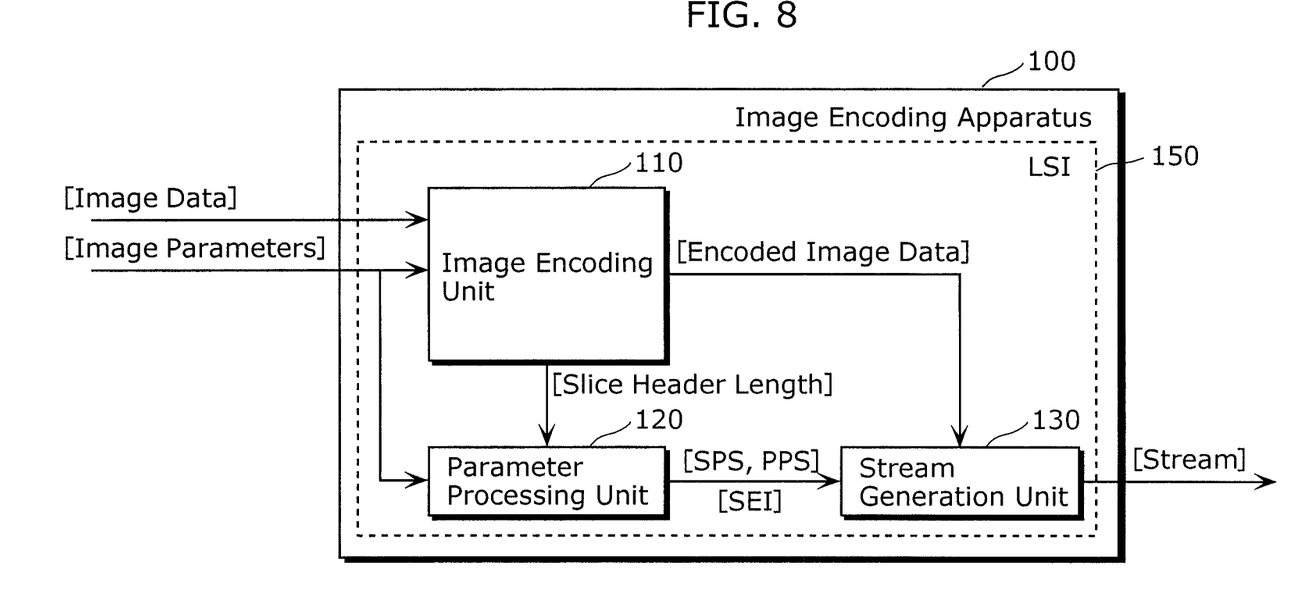
FIG. 8 is a block diagram illustrating an example of a functional configuration in the case where an image encoding apparatus according to an embodiment has been implemented as an LSI.

FIG. 8 is a block diagram illustrating an example of a functional configuration in the case where the image encoding apparatus 100 according to the embodiment has been implemented as an LSI.

An LSI 150 illustrated in FIG. 8 is an example of an image encoding integrated circuit according to the present invention, and is configured of a single-chip LSI.

Figure 9:
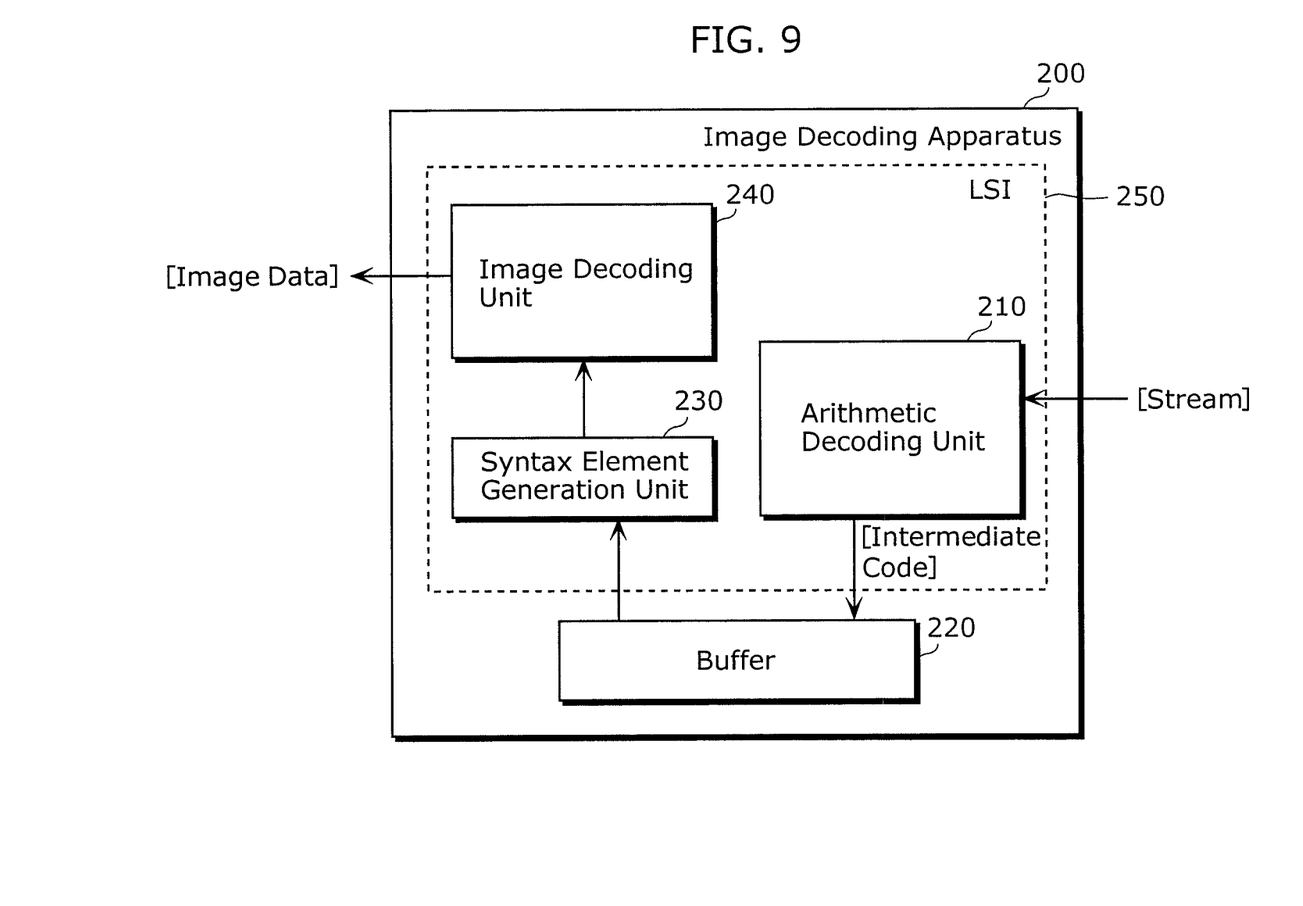
FIG. 9 is a block diagram illustrating an example of a functional configuration in the case where an image decoding apparatus according to an embodiment has been implemented as an LSI.

FIG. 9, meanwhile, is a block diagram illustrating an example of a functional configuration in the case where the image decoding apparatus 200 according to the embodiment has been implemented as an LSI.

An LSI 250 illustrated in FIG. 9 is an example of an image decoding integrated circuit according to the present invention, and is configured of a single-chip LSI.

Note that the respective functional configurations of the LSI 150 and LSI 250 illustrated in FIGS. 8 and 9 may be functional configurations aside from those illustrated in FIGS. 8 and 9. For example, the LSI 250 may further include the buffer 220.

Meanwhile, the circuit integration method is not limited to LSI; the apparatuses may be implemented as dedicated circuits or generic processors, or FPGAs (Field Programmable Gate Arrays) that can be programmed after the LSI manufacture, configurable processors in which the connections, settings, and so on of circuit cells within the LSIs can be reconfigured, or the like may be used.

Furthermore, if other technologies that improve upon or are derived from semiconductor technology enable integration technology to replace LSIs, then naturally it is also possible to integrate the functional blocks using that technology. For example, the application of biotechnology or the like can be considered as one such possibility.

The present invention can be used in an image encoding apparatus that encodes images according to CABAC and an image decoding apparatus that decodes that encoded image data. More specifically, the present invention can be used in an image encoding apparatus that encodes high-definition video encoded through data compression techniques defined by H.264/AVC and an image decoding apparatus for decoding (playing back) encoded image data generated thereby.

The invention claimed is:

1. An image encoding apparatus that encodes image data, the image encoding apparatus comprising:
an image encoding unit configured to receive an input of the image data and image parameters and generate encoded image data by performing image encoding on the image data with reference to the image parameters and furthermore binarizing and entropy-encoding the image data;
a parameter processing unit configured to (i) output, as parameter information, a parameter set that is a duplication of a part of the image parameters and that is referred to when the encoded image data is entropy-decoded, without encoding the parameter set, and (ii) encode the image parameters to generate and output encoded image parameters; and
a stream generation unit configured to generate and output, to an external output apparatus, a stream including the encoded image data obtained from the image encoding unit and header information including the parameter information not encoded and the encoded image parameters that are outputted from the parameter processing unit,
wherein the header information redundantly includes the non-encoded parameter set as the parameter information and as a duplicate of an encoded parameter set included in the encoded image parameters.

2. The image encoding apparatus according to claim 1, wherein the parameter information indicates parameters referred to when the image encoding unit entropy-encodes the image data using H.264/AVC CABAC (Context-based Adaptive Binary Arithmetic Coding).

3. The image encoding apparatus according to claim 2, wherein the parameter information includes an entropy_coding_mode_flag using H.264/AVC CABAC (Context-based Adaptive Binary Arithmetic Coding).

4. The image encoding apparatus according to claim 2, wherein the parameter information includes information expressing a data amount from the head of a nal_unit to the start of a slice_data( ) in the nal_unit that includes the slice_data( ) using H.264/AVC CABAC (Context-based Adaptive Binary Arithmetic Coding).

5. The image encoding apparatus according to claim 1, wherein the stream generation unit is configured to place the parameter information before a variable-length codeword that is to be entropy-decoded, when generating the stream.

6. The image encoding apparatus according to claim 1, wherein the stream generation unit is configured to store the parameter information within a user_data_unsigned_ SEI using H.264/AVC CABAC (Context-based Adaptive Binary Arithmetic Coding) when generating the stream.

7. An image encoding method that encodes image data, the image encoding method comprising:
receiving an input of the image data and image parameters and generating encoded image data by performing image encoding on the image data with reference to the image parameters and furthermore binarizing and entropy-encoding the image data;

outputting, as parameter information, a parameter set that is a duplication of a part of the image parameters and that is referred to when the encoded image data is entropy-decoded, without encoding the parameter set, and encoding the image parameters to generate and output encoded image parameters; and generating and outputting to an external output apparatus, a stream including the generated encoded image data and header information including the outputted parameter information not encoded and encoded image parameters, wherein the header information redundantly includes the non-encoded parameter set as the parameter information and as a duplicate of an encoded parameter set included in the encoded image parameters.

8. An image decoding apparatus that decodes encoded image data that is image data that has been binarized and entropy-encoded, the image decoding apparatus comprising:

an entropy-decoding unit configured to receive an input of a stream having the encoded image data and header information including parameter information with a parameter set that is not encoded, which is a duplication of a part of the image parameters and referred to when entropy-decoding the encoded image data, and entropy-decode the encoded image data with reference to the parameter set included in the parameter information without decoding the parameter information; and an image decoding unit configured to restore an image based on the entropy-decoded image data, wherein the header information redundantly includes the non-encoded parameter set as the parameter information and as a duplicate of an encoded parameter set included in the encoded image parameters.

9. An image decoding method that decodes encoded image data that is image data that has been binarized and entropy-encoded, the image decoding method comprising:

receiving an input of a stream having the encoded image data and header information including parameter information with a parameter set that is not encoded, which is a duplication of a part of the image parameters and referred to when entropy-decoding the encoded image data, and entropy-decoding the encoded image data with reference to the parameter set included in the parameter information without decoding the parameter information; and restoring an image based on the entropy-decoded image data, wherein the header information redundantly includes the non-encoded parameter set as the parameter information and as a duplicate of an encoded parameter set included in the encoded image parameters.

10. A non-transitory computer-readable recording medium storing a program, for encoding image data which, when executed by a computer, causes the computer to execute steps comprising:

receiving an input of the image data and image parameters and generate encoded image data by performing image encoding on the image data with reference to the image parameters and furthermore binarizing and entropy-encoding the image data;

outputting, as parameter information, a parameter set that is a duplication of a part of the image parameters and that is referred to when the encoded image data is entropy-decoded, without encoding the parameter set, and encoding the image parameters to generate and output encoded image parameters; and generating a stream including the generated encoded image data and header information including the outputted parameter information not encoded and encoded image parameters, wherein the header information redundantly includes the non-encoded parameter set as the parameter information and as a duplicate of an encoded parameter set included in the encoded image parameters.

11. An image encoding integrated circuit that encodes image data, the image encoding integrated circuit comprising:

an image encoding unit configured to receive an input of the image data and image parameters and generate encoded image data by performing image encoding on the image data with reference to the image parameters and furthermore binarizing and entropy-encoding the image data;

a parameter processing unit configured to (i) output, as parameter information, a parameter set that is a duplication of a part of the image parameters and that is referred to when the encoded image data is entropy-decoded, without encoding the parameter set, and (ii) encode the image parameters to generate and output encoded image parameters; and a stream generation unit configured to generate and output, to an external output apparatus, a stream including the encoded image data obtained from the image encoding unit and header information including the parameter information not encoded and the encoded image parameters that are outputted from the parameter processing unit, wherein the header information redundantly includes the non-encoded parameter set as the parameter information and as a duplicate of an encoded parameter set included in the encoded image parameters.

12. An image decoding integrated circuit that decodes encoded image data that is image data that has been entropy-encoded, the image decoding integrated circuit comprising:

an entropy-decoding unit configured to receive an input of a stream having the encoded image data and header information including parameter information with a parameter set that is not encoded, which is a duplication of a part of the image parameters and referred to when entropy-decoding the encoded image data, and entropy-decode the encoded image data with reference to the parameter set included in the parameter information without decoding the parameter information; and an image decoding unit configured to restore an image based on the entropy-decoded image data, wherein the header information redundantly includes the non-encoded parameter set as the parameter information and as a duplicate of an encoded parameter set included in the encoded image parameters.

\* \* \* \* \*